United States Patent
Sievers

(10) Patent No.: US 6,988,704 B2
(45) Date of Patent: Jan. 24, 2006

(54) BASE FRAME FOR USE WITH A BASE STATION IN MOBILE COMMUNICATION

(75) Inventor: Reiner Sievers, Rheinberg/Wallach (DE)

(73) Assignee: E-Plus, Dusseldorf (DE)

(*) Notice: Subject to any disclaimer, the term of this patent is extended or adjusted under 35 U.S.C. 154(b) by 97 days.

(21) Appl. No.: 10/290,065

(22) Filed: Nov. 7, 2002

(65) Prior Publication Data
US 2003/0106274 A1 Jun. 12, 2003

(30) Foreign Application Priority Data
Nov. 7, 2001 (DE) .......................... 201 17 971 U

(51) Int. Cl.
F16M 1/00 (2006.01)

(52) U.S. Cl. .............. 248/676; 248/295.11; 248/163.1; 211/191

(58) Field of Classification Search ................ 248/676, 248/677, 678, 670, 346.07, 295.11, 172, 163.1, 248/166, 165, 440; 182/113, 119, 150, 128, 182/222, 186.9; 211/189, 187, 192, 191, 211/195, 201, 193; 403/217; 52/292, 651.1, 52/506.03, 653.1, 633
See application file for complete search history.

(56) References Cited

U.S. PATENT DOCUMENTS

| | | | | |
|---|---|---|---|---|
| 3,006,669 A | * | 10/1961 | Novales | |
| 3,365,073 A | * | 1/1968 | Degener | |
| 3,463,325 A | * | 8/1969 | Zagotta | |
| 5,000,290 A | * | 3/1991 | Seely | 182/222 |
| 5,845,795 A | * | 12/1998 | Mulholland | 211/192 |
| 6,266,938 B1 | * | 7/2001 | Sheu et al. | 248/676 |

* cited by examiner

*Primary Examiner*—Gwendolyn Baxter
(74) *Attorney, Agent, or Firm*—Michaelson & Associates; Peter L. Michaelson; Alberta A. Vitale

(57) ABSTRACT

A base frame (2) for use with a base station in mobile communication (aerial, operating cabinet) comprising a first and second cross arm (3, 4), frictionally connected or clamped, and adjustably connected by means of stays (11, 12, 13, 14) to a supporting surface (1), whereby the first and second cross arm are arranged at a distance from the supporting surface (1), a first and second longitudinal arm (3, 4) adjustably frictionally connected or clamped to the first and second cross arm (5, 6).

5 Claims, 4 Drawing Sheets

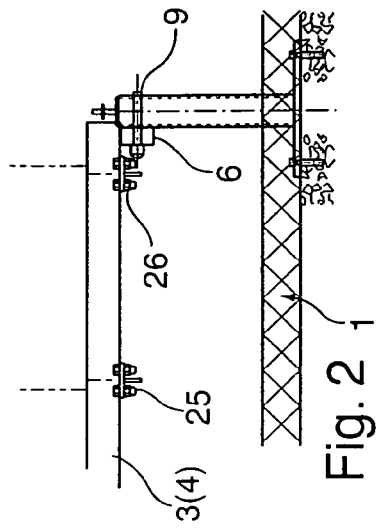
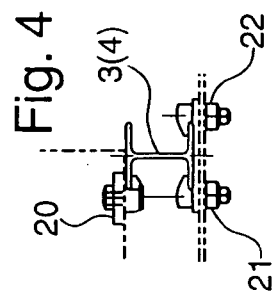
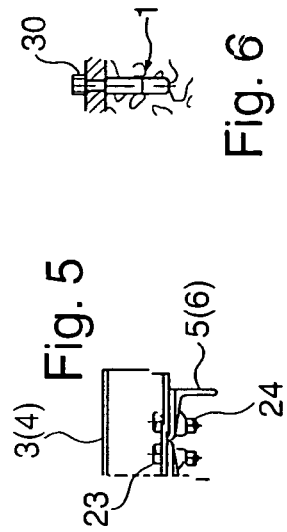
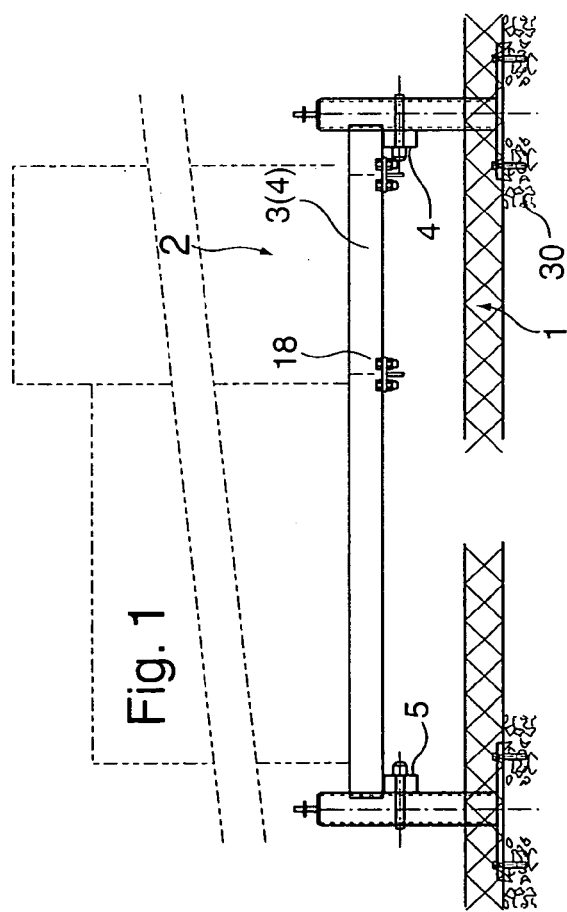
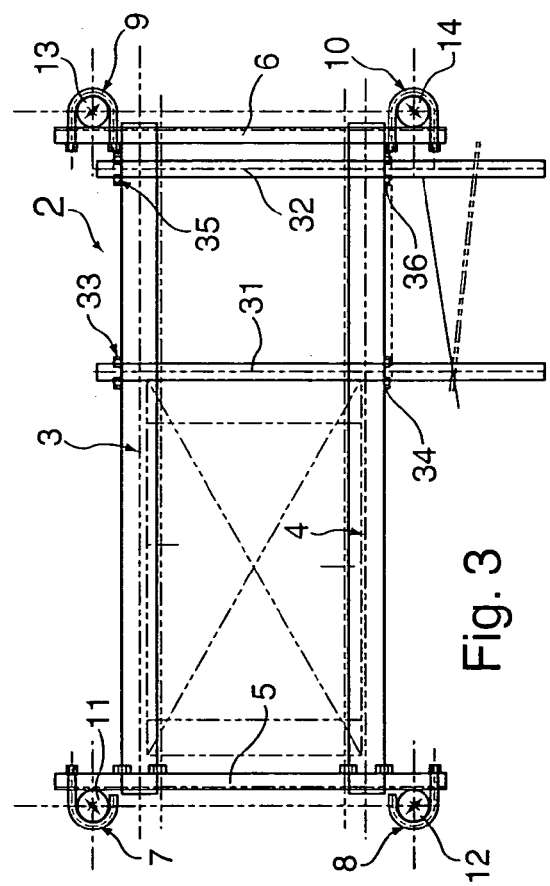

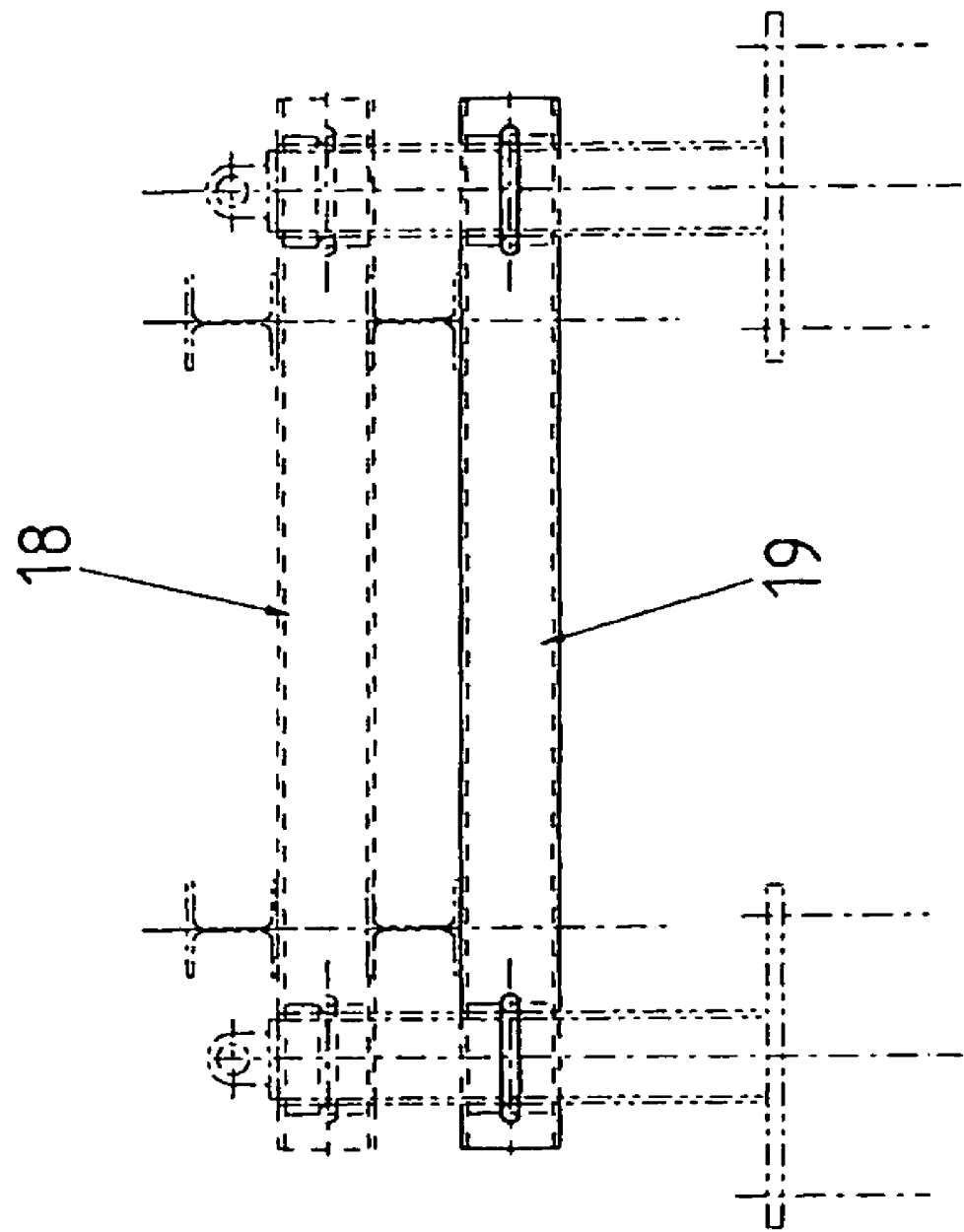

BASE FRAME FOR USE WITH A BASE STATION IN MOBILE COMMUNICATION

FIELD OF THE INVENTION

The invention relates to a base frame for use with a base station in mobile communication (aerial, operating cabinet).

BACKGROUND

Base frames of the type assumed according to the field of the invention form part of the state of the art. As a rule, they consist of welded steel tubes and/or sectional steel parts, which are provided with a weather-resistant coat and/or are hot-dip galvanized. Such base frames are frequently fixed on buildings. Since the base frames are large and bulky and, therefore, have a considerable weight, they are either lifted onto the respective buildings by means of special cranes and/or transported to their place of use by means of cargo helicopters, put down there and subsequently fixed to the ground, e.g. on a flat roof of a high-rise building.

First of all, the handling of these frames is a drawback since both special cranes and cargo helicopters involve heavy costs, not to mention the calling in of expensive experts for the handling of such heavy and bulky loads. The accident risk too must not be disregarded. Moreover, base frames of this type are manufactured by specialist companies which have to receive the order a long time before the erection of the respective base station since delivery of the frames often takes several months so that accurate coordination of the time schedules of the mobile communication company, on the one hand, and of the manufacturer, on the other, is required for the base frames. It is hardly possible to modify the frames at the location of installation and then since they constitute a rigid, frame-like object. This means that following order placing for the manufacture of base frames, modifications to the base frames which may have been forced on due to local conditions can hardly be carried out any more. Subsequent repairs too, made necessary due to climatic effects such as corrosion, replacement of parts or the like, are only possible by destroying the respective base frame or by its complete replacement which involves further heavy costs.

SUMMARY

It is the object of the invention to completely eliminate the drawbacks of the prior art and, in addition, to substantially simplify the manageability of such base frames.

The object is achieved according to the invention, which can comprise a base frame for use with a base station in mobile communication (aerial, operating cabinet) comprising a first and second cross arm, frictionally connected or clamped, and which can be adjustably connected by means of stays to a supporting surface, whereby the first and second cross arm may be arranged at a distance from the supporting surface, a first and second longitudinal arm which can be adjustably frictionally connected or clamped to the first and second cross arm.

A base frame according to the invention can be used particularly advantageously for so-called base stations in mobile communication. Due to the fact that the longitudinal and first and second cross arm as well as the stays are frictionally coupled with each other, the component parts of the base frame can be taken to the respective place of use as separate components, e.g. carried by persons, so that expensive construction cranes or cargo helicopters are no longer required.

A further advantage is offered in that decoupling between the planning time for erection of the base station and/or the mobile communication aerial, on the one hand, and manufacture of the base frames, on the other, is possible without problems since the longitudinal and first and second cross arm as well as the stays can be manufactured in store as a kit (module) from where they can be called up, if required, and assembled into the respective base frames required. Thanks to the frictional or clamp fit connection of longitudinal and first and second cross arm and of the stays, it is also possible to compensate changes in dimension there and then without problems and without any need for expensive and difficult conversions.

Moreover, it is not only possible to alter the longitudinal and cross dimensions of the base frame at the respective place of use smoothly in order to interconnect the longitudinal and first and second cross arm at the respectively desired position frictionally, but in one piece, but the teaching according to the invention also opens up the opportunity of arranging the first and second longitudinal arm and the first and second cross arm serving for accommodation of switch cabinets, mobile communication aerials or the like on the spot at different levels at the stays since these dimensions too can be altered smoothly thanks to the frictional or clamp fit connection of the stays.

An embodiment according to the invention, wherein the first and second cross arm may be lockable at a desired level in relation to the stays and the supporting surface, is advantageous since it allows quick installation in a predefined position. The first and second cross arm may be lockable, by providing an edge or a notch on the stays, corresponding with the shape of the cross section of the first and second cross arm, at equal distance from the supporting surface, permits easy fitting when assembling the base frame.

A further embodiment according to the invention, wherein the first and second cross arm may be adjustably frictionally connected or clamped with the stays by means of stirrup bolts, is advantageous since stirrup bolts provide excellent adjustable frictional connections.

A further embodiment according the invention, wherein the first and second longitudinal arm may be designed as double T arms in cross-section, with the webs that can be arranged orthogonal with reference to the supporting surface and the relevant flanges that can be arranged essentially parallel to the supporting surface, whereas the first and second cross arm may have a U-shaped or L-shaped cross-section in such a way that their U-legs may be directed towards the inside and against each other, while the webs connecting the U-legs in each case may be frictionally or clamp fit resting against the wall sections directed towards the inside of the allocated stays, is advantageous since the resultant construction will, though particularly simple, nevertheless be rugged.

A further embodiment according to the invention, wherein the first and second longitudinal arm are adjustably frictionally connected or clamped to the first and second cross arm by means of clamping screws, is advantageous, since it allows quick and easy installation and the position of the first and second longitudinal arm can be chosen freely.

A further embodiment according to the invention, which may comprise a first and second cantilever arm adjustably, frictionally connected or clamped to the first and second longitudinal arm, forming a suitable platform for gratings or the like for arranging further parts of the ground station, has the advantage of providing simple means for arranging further parts of the ground station on a platform.

A further embodiment according to the invention, wherein the first and second cantilever arm may be lockable with respect to the first and second longitudinal arm, may provide for easy fitting and installation.

Edges or notches on the first and second longitudinal arm and corresponding edges or nodges on the first and second cantilever arm may provide for a lockable predefined position, easily perceived by an installation worker.

A further embodiment according to the invention, wherein the first and second cantilever arm may be arranged at approximately mid-section of the base frame protruding at, preferably, equal distance beyond the longitudinal side of the one longitudinal arm towards the outside, may be advantageous since it allows equal distribution of forces that may be exerted on the frame, i.e. by wind. A further advantage may be an aesthetic appearance of the frame.

Various elements of the above mentioned embodiments could be used in combination together according to the invention.

BRIEF DESCRIPTION OF THE DRAWINGS

The drawing illustrates the invention—partly diagrammatically—by way of practical examples. In this drawing:

FIG. 1 shows a base frame according to the invention in side elevation in an initial mounting situation;

FIG. 2 shows a base frame according to FIG. 1 in a second mounting situation, represented partly broken;

FIG. 3 shows a top plan view relating to FIG. 1;

FIG. 4 shows a detail regarding a connection for a cabinet, designed as an operating cabinet housing to be arranged on the base frame, for accommodating the electric and/or electronic components;

FIG. 5 shows a detail from FIGS. 1 and 2 regarding a so-called "Lindapter" at the transition of longitudinal and cross arms;

FIG. 6 shows the arrangement of a stay for holding the base frame in the ground on an enlarged scale compared to FIG. 2;

FIG. 10 shows a side elevation of a base frame adjusted at different vertical intervals.

LIST OF REFERENCE NUMERALS

Figure 8:
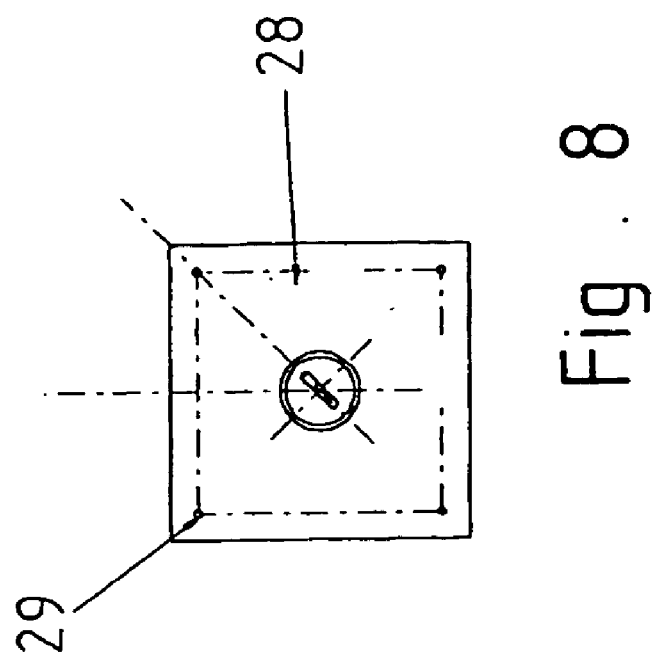
FIG. 8 shows a top plan view relating to FIG. 7.

1 Supporting surface
2 Base frame
3 Longitudinal arm
4 "
5 Cross arm
6 "
7 Stirrup bolt
8 "
9 "
10 "
11 Stay
12 "
13 "
14 "
15 Section, curved
16 Bolt part
17 "
18 Mounting situation
19 "
20 Clamping screw
21 "
22 "
23 "
24 "
25 "
26 "
27 Tube
28 Base plate
29 Through-hole
30 Fixing screw
31 Cantilever arm
32 "
33 Clamping screw
34 "
35 "
36 "

DETAILED DESCRIPTION

Reference numeral 1 designates a supporting surface, e.g. a roof or a wall of a high-rise building, on which a base station for mobile communication is to be arranged. An aerial required for this as well as an operating cabinet accommodating electric and/or electronic components (not shown) are arranged on a base frame, which is collectively designated with the reference numeral 2. The shape of the base frame 2 is designed in a rectangle shape for all embodiments seen in the drawing in top plan view; however, it can also have a different shape, e.g. quadratic.

The base frame 2 may have two longitudinal arms 3 and 4 running in parallel as well as at a distance to each other. The longitudinal arms 3 and 4 are, preferably, designed as section arms, especially as double T arms, which, in the embodiments illustrated, are each of equal length and have the same shape of section.

A pair of cross arms 5 and 6, likewise running at a distance to, as well as in parallel with each other, are arranged transversely in relation to the longitudinal arms 3 and 4.

The cross arms 5 and 6 can be attached to a pair of stays 11–14, supports, props, studs, braces or brackets each.

Figure 9:
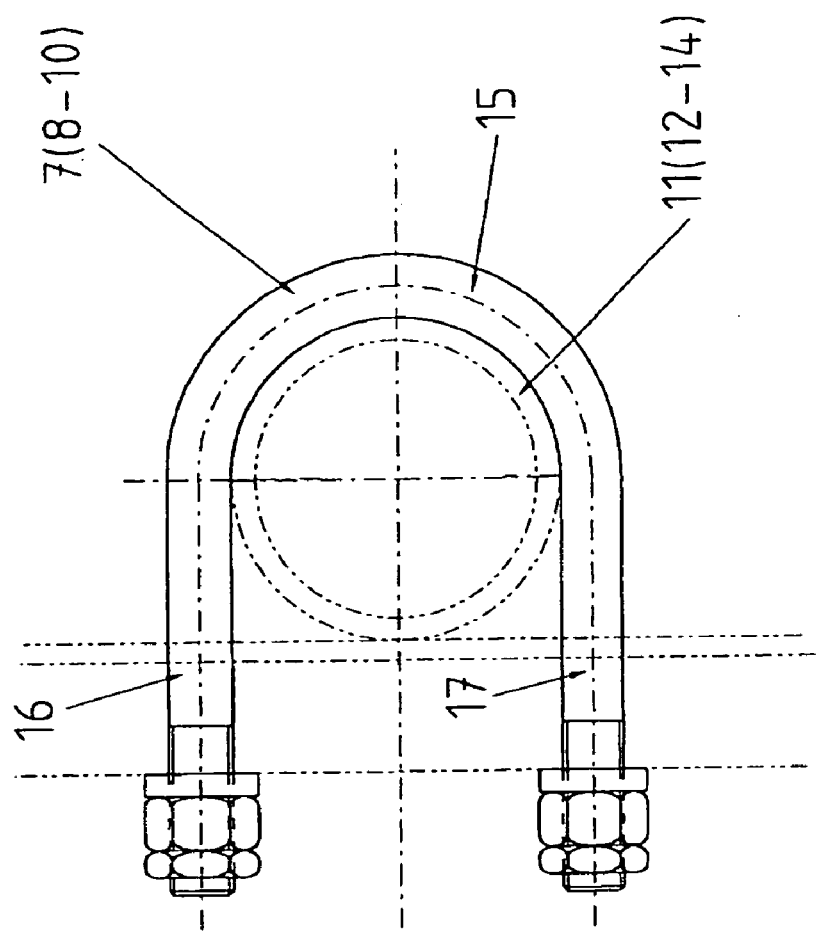
FIG. 9 shows a top plan view of a stirrup bolt.

In the embodiments illustrated, the cross arms 5 and 6 are likewise of equal size and cross-section and are, preferably, also designed as section arms. In the drawing, the cross arms 5 and 6 are designed as U-shaped sections with their webs facing outwards, whereas the flanges connecting the webs are arranged in such a way as to be directed towards the inside and against each other and extend at the same level. Each of the cross arms 5 and 6 projects on both sides beyond the outer limiting means of the longitudinal arms 3 and 4 and is adjustably frictionally connected or clamped in these areas by means of one each stirrup bolt 7, 8, 9 and/or 10 with one each stay 11, 12, 13 and/or 14 of equal length extending orthogonal to the supporting surface 1. One of these stirrup bolts is illustrated in FIG. 9 on a larger scale. As one can see, each of the stirrup bolts 7 to 10 embraces the allocated stay 11 to 14 at an angle of segment of appr. 180 degrees. For this purpose, each stirrup bolt 7 to 10 has a curved section 15 corresponding in its radius to the outer radius of the allocated stay 11 to 14. One each bolt part 16 and/or 17 joins up with the curved section 15, the bolt parts 16 and 17 each being of equal length and having the same cross-sectional dimensions and being provided with threads at their free ends onto which the nuts can be screwed with lock nuts (FIG. 9). The bolt parts 16 and 17 pass through through-holes of adapted shape in the webs of the cross arms 5 and 6, the free ends of the bolt parts 16 and 17 of the individual stirrup bolts 7 to 10 are each directed inwards and against each other (FIG. 3). This makes it possible to arrange the base frame 2 formed essentially from the longitudinal arms 3 and 4 as well as the cross arms 5 and 6 at different levels in relation to the supporting surface 1 which, for instance, is indicated diagrammatically in FIG. 10 with the different mounting situations 18 and 19.

The longitudinal arms 3 and 4 rest on the upward facing U legs of the cross arms 5 and 6, the longitudinal arms 3 and 4 being adjustably frictionally connected or clamped with the respective arms by special clamping screws, for example "Lindapter" Type AFK M12 with AF16CW. It is also possible to use arms of L-shaped cross-section (FIG. 5) instead of arms 5 and 6 of U-shaped cross-section. For instance, the different clamping screws for fixing the individual longitudinal arms 3 and 4 to the cross arms 5 and 6 can be seen in FIGS. 4 and 5 where, among others, they are designated with the reference numerals 20, 21, 22, 23, 24, 25 and 26. These clamping screws frictionally connect the longitudinal arms 3, 4 and the cross arms 5, 6 with each other into a frame-like base frame 2. Instead of two longitudinal and cross arms 3, 4 or 5, 6 respectively it is also possible that more than two longitudinal and cross arms are arranged, to form the base frame 2.

Figure 7:
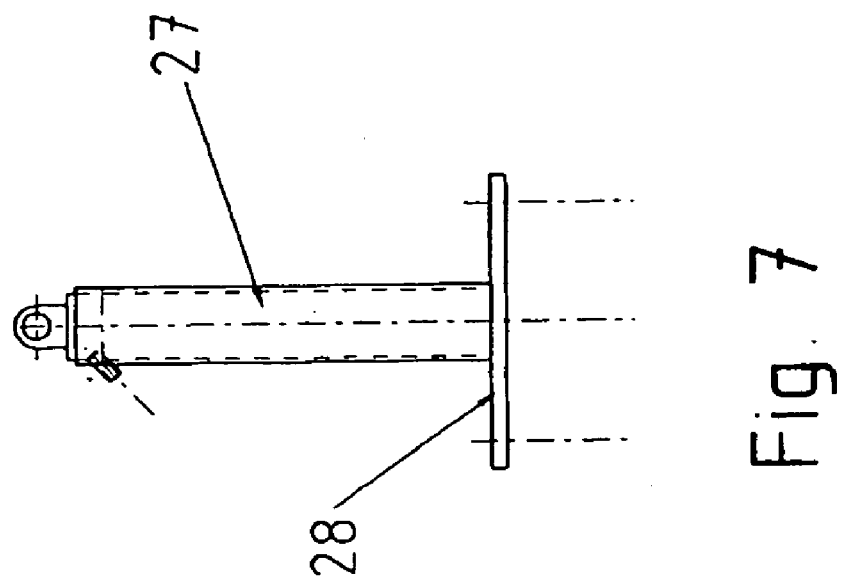
FIG. 7 shows a stay in side elevation.

The design of the stays 11 to 14 can be seen particularly in FIGS. 7 and 8. According to these figures, each of the stays 11 to 14 is provided with a tube 27 (FIG. 7) arranged orthogonal in relation to the supporting surface 1 in the drawing which, on its side facing the supporting surface 1, is provided in one piece with a base plate 28 which is square in top plan view (FIG. 8) and has one each through-hole in its corner areas of which only one of the through-holes has been designated with the reference numeral 29. A fixing screw 30 (FIG. 6) with an end section of tapered diameter and provided with a thread at its top (outer side) passes through each of the through-holes 29. With this threaded, tapered length section, each of the fixing screws 30 passes through the allocated through-hole 29 of the base plate 28 and protrudes with one free end section from the base plate 28 so that one each screw with a check nut can be screwed onto the thread. Besides, the fixing screws 30 are firmly arranged in the supporting surface 1 so that the entire base frame 2 can be fixed on the supporting surface 1 in one piece, but detachably.

In the embodiment shown in FIG. 3, two cantilever arms 31 and 32 extending transversely in relation to the longitudinal axis of the base frame are adjustably frictionally connected or clamped in way of the one end section by means of clamping screws 33, 34 and/or 35, 36, i.e. with the respective bottom flanges of the longitudinal arms 3 and 4 in such a way that the cantilever arms 31 and 32 protrude towards the outside on one side above the longitudinal arm 4 creating space here for the arrangement of a further erection surface, e.g. for a grating or the like for arranging further parts of the ground station (not shown).

The longitudinal arms 3 and 4 and the cantilever arms 31 and 32 may have cooperating edges or notches to provide for easy matching and fitting in a limited number of positions. When building the base frame a mechanic does not need to measure up the exact position of a cantilever arm with respect to the longitudinal arm, but can merely count the edges or notches.

Also feasible is using equally spaced holes in the longitudinal arms 3,4 flanges and corresponding and cooperating pins attached to the cantilever arms 31, 32.

The features described in the patent claims and in the specification and evident from the drawing can prove to be essential both individually and in any combination for the embodiment of the invention.

What is claimed is:

1. A base frame (2) for use with a base station in mobile communication for mounting an aerial and/or an operating cabinet, comprising:
    first and second cross arms (5, 6), frictionally connected or clamped, and adjustably connected by means of stays (11, 12, 13, 14) to a supporting surface (1), while the first and second cross arms are arranged at a distance from the supporting surface (1);
    first and second longitudinal arms (3, 4) adjustably frictionally connected or clamped to the first and second cross arms (5, 6); and
    wherein the base frame further comprises first and second cantilever arms (31, 32) adjustably frictionally connected or clamped to the first and second longitudinal arms (3, 4), forming a suitable platform for gratings or further parts of the base station.

2. The base frame according to claim 1, wherein the first and second cantilever arms (31, 32) are lockable with respect to the first and second longitudinal arms (3, 4).

3. The base frame according to claim 1, wherein the first and second cantilevers arm (31, 32) are arranged at approximately mid-section of the base frame with each cantilever arm protruding a substantially equal distance beyond a longitudinal side of one of the first and second longitudinal arms (4) towards an outside portion of a respective one of the first and second longitudinal arms 4).

4. A base frame (2) for use with a base station in mobile communication for mounting an aerial and/or an operating cabinet, comprising:
    first and second cross arms (5, 6) frictionally connected or clamped and adjustably connected by means of stays (11, 12, 13, 14) to a supporting surface (1), the first and second cross arms being arranged at a distance from the supporting surface, and lockable at a desired level in relation to the stays and the supporting surface;
    first and second longitudinal arms (3, 4) adjustably frictionally connected or clamped to the first and second cross arms (5, 6); and
    first and second cantilever arms (31, 32) adjustably frictionally connected or clamped to the first and second longitudinal arms and forming a suitable platform for gratings or further parts of the base station;
    wherein the first and second cross arms are adjustably frictionally connected or clamped with the stays (11, 12, 13, 14) through use of stirrup bolts (7, 8; 9, 10).

5. The base frame according to claim 4, wherein the first and second cantilever arms are lockable with respect to the first and second longitudinal arms.

* * * * *